United States Patent
Zhang et al.

(10) Patent No.: US 10,177,267 B2
(45) Date of Patent: Jan. 8, 2019

(54) PHOTODETECTOR

(71) Applicant: BOLB INC., San Jose, CA (US)

(72) Inventors: Jianping Zhang, San Jose, CA (US); Ling Zhou, San Jose, CA (US); Ying Gao, San Jose, CA (US)

(73) Assignee: BOLB INC., San Jose, CA (US)

( * ) Notice: Subject to any disclaimer, the term of this patent is extended or adjusted under 35 U.S.C. 154(b) by 12 days.

(21) Appl. No.: 15/449,638

(22) Filed: Mar. 3, 2017

(65) Prior Publication Data
US 2018/0254371 A1  Sep. 6, 2018

(51) Int. Cl.
| H01L 31/112 | (2006.01) |
| H01L 31/0304 | (2006.01) |
| H01L 31/107 | (2006.01) |
| H01L 31/0224 | (2006.01) |
| H01L 31/18 | (2006.01) |

(52) U.S. Cl.
CPC .. H01L 31/1121 (2013.01); H01L 31/022408 (2013.01); H01L 31/03048 (2013.01); H01L 31/107 (2013.01); H01L 31/1848 (2013.01)

(58) Field of Classification Search
CPC .......... H01L 31/06875; H01L 31/0693; H01L 31/073; H01L 31/0735; H01L 31/074; H01L 31/0749; H01L 31/1032–31/1037; H01L 31/1804; H01L 31/1808; H01L 31/1828–31/1856; H01L 31/202; H01L 33/0025; H01L 33/0029; H01L 33/0054; H01L 33/0062–33/0075; H01L 33/0083–33/0091; H01L 33/28–33/34
See application file for complete search history.

(56) References Cited

U.S. PATENT DOCUMENTS

| 2003/0160231 | A1* | 8/2003 | Cole | G01J 3/26 257/22 |
| 2006/0081768 | A1* | 4/2006 | Dutta | H01L 27/14634 250/214.1 |
| 2006/0165143 | A1* | 7/2006 | Ohno | B82Y 20/00 372/46.015 |
| 2008/0299495 | A1* | 12/2008 | Xi | G03F 7/20 430/314 |
| 2011/0018087 | A1* | 1/2011 | Boutami | H01L 31/101 257/442 |
| 2013/0221406 | A1* | 8/2013 | Gaska | H01L 29/66431 257/191 |
| 2015/0333218 | A1* | 11/2015 | Han | H01L 33/06 257/13 |
| 2016/0276529 | A1* | 9/2016 | Ma | H01L 33/06 |

* cited by examiner

*Primary Examiner* — Mohammed R Alam
(74) *Attorney, Agent, or Firm* — J.C. Patents (57) ABSTRACT

An UV photodetector includes: a substrate, a template layer formed on the substrate, an intrinsic AlGaN layer formed on the template layer, a first n-type AlGaN layer and a second n-type AlGaN layer formed on the intrinsic AlGaN layer side-by-side and separated by a gap, wherein the gap exposes the intrinsic AlGaN layer. Another UV photodetector includes: an UV transparent substrate, an UV transparent template layer formed on the substrate, a first UV transparent n-type AlGaN layer formed on the UV transparent template layer, an intrinsic AlGaN layer formed on the first UV transparent n-type AlGaN layer, a second n-type AlGaN layer formed on the intrinsic AlGaN layer, and a p-type layer formed on the second n-type AlGaN layer.

14 Claims, 9 Drawing Sheets

PHOTODETECTOR

FIELD OF THE INVENTION

The present invention relates in general to semiconductor photodetectors, more particularly to group III nitride ultraviolet photodetectors, such as photodetectors of responsivity larger than 1 A/W.

DESCRIPTION OF THE RELATED ART

Solar blind wavelength cutoff on the Earth surface is defined at 280 nm because the strong ultraviolet (UV) absorption to the solar spectrum by the ozone layer limits the Earth surface UV irradiance at 280 nm to be extremely low, at about $4.7 \times 10^{24}$ mW/cm$^2$. This translates into a 280 nm photon flux of $6.6 \times 10^{-9}$/cm$^2$·s. Suppose a UV photodetector is of 100% external quantum efficiency (EQE) and a unit current gain, under such small photon flux the photo-induced current would be $1.06 \times 10^{-27}$ A. Even if the photodetector possesses a current gain as large as $10^6$, as for an ideal avalanchephotodetector (APD) or a photomultiplier tube (PMT), the photo-induced current would still be $1.06 \times 10^{-21}$ A, too small to detect. As such, unlike visible and infrared emissions and detections, solar blind UV emission and detection on the earth surface will have very low background noise, even under the full solar presence, making it very promising for covert and highly reliable communications. On the other hand, since flames and electric coronas contain infrared and solar blind UV emissions, solar blind UV detection is thus of great desire for early warning of fire, electric corona, and missile detection.

Nitride compound semiconductors such as GaN, AlN, and their ternary alloys are viewed as very promising solar blind photodetector materials. Depending on alloy composition, nitride compounds can enable UV emissions and detections ranging from 410 nm down to approximately 205 nm, covering a wide solar blind spectrum.

One kind of widely used photodetector is named as PIN photodetector, made of a light absorbing intrinsic semiconductor sandwiched by a P-type and an N-type semiconductor. The N-type semiconductor is positively biased regarding to the P-type semiconductor, and photons absorbed by the intrinsic semiconductor knock out of electrons and holes into conduction and valence bands, respectively. The photon-induced electrons and holes will respectively drift to the N-type and P-type semiconductors under the external bias, resulting in photocurrent. If the external bias is moderate, the photocurrent is purely produced by photon-induced carriers within the intrinsic semiconductor and there is no current gain (or there is gain but the gain equals to 1). Thus the PIN photodetector's responsivity can be calculated as $$R = \frac{I}{P_o} = \frac{\frac{I}{e}e}{\frac{P_o}{hv}hv} = \eta\frac{e}{hv}.$$

Here R, I, $P_o$, e, hv, and η are respectively responsivity, photocurrent, optical power, electron's elementary charge, photon's energy and external quantum efficiency. As seen, for a PIN photodetector, the responsivity is in reverse proportional to the photon's energy. For a 280 nm PIN photodetector, R is limited to be not larger than 0.225 A/W.

If a PIN photodetector is made of very high quality semiconductors and can sustain substantially large reverse bias, biased at the proximity of the PIN breakdown voltage, the PIN Photodetector may turn into an avalanche photodetector (APD). In an APD, the electric field in the intrinsic semiconductor is so large that photon-induced carriers can gain enough kinetic energy to knock out of additional carriers contributing to current. In such an avalanche process, one photon-induced carrier can result in $10^6$ additional carriers making the current gain equals to $10^6$. APDs are among the most sensitive photodetectors; however, solid-state solar blind ADPs are not yet available owing to the poor material quality of high Al-content AlGaN semiconductors.

Figure 1A:
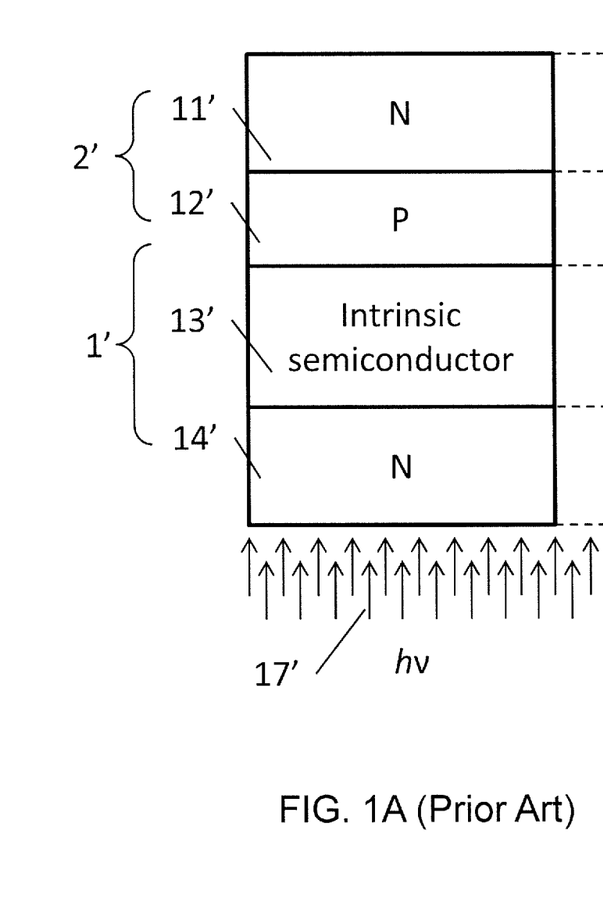
FIG. 1A illustrates a layer structure of a prior art phototransistor type photodetector
Figure 1B:
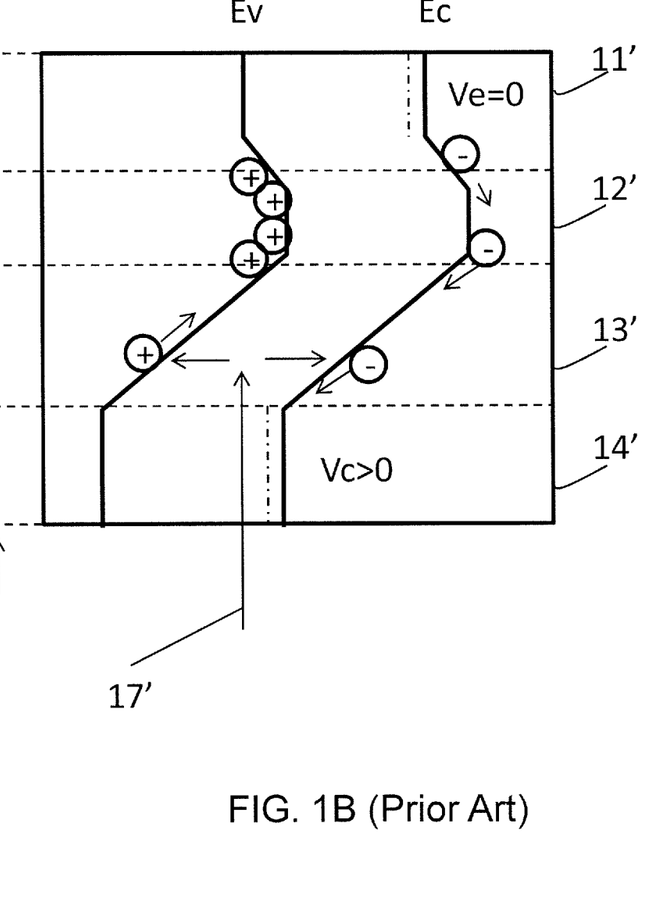
FIG. 1B illustrates the band diagram of the photodetector shown in FIG. 1A.

There is another type of photodetector called phototransistor which can have large current gain hence large responsivity. The layer structure and band diagram of a prior art phototransistor type photodetector (e.g. U.S. Pat. No. 6,137,123) are illustrated in FIG. 1A and FIG. 1B, respectively. As depicted in FIG. 1A, the phototransistor contains an N-type semiconductor layer 14', an intrinsic semiconductor layer 13', a P-type semiconductor layer 12' and another N-type semiconductor layer 11', stacked in sequence. Layers 12' and 11' form PN junction 2', and layers 12', 13', and 14' form PN junction 1'. When functioning as a photodetector, photon flux 17' is received by layer 13' transmitted through layer 14', which is named as collector and positively biased with a voltage $V_c$, while layer 11', named as emitter, is grounded or negatively biased with a voltage $V_e$. The positive bias on layer 14' regarding to layer 11' sets PN junctions 1' and 2' in reverse and forward bias, respectively. Light absorbing layer 13' absorbs photon flux 17' and electrons and holes are excited to conduction and valence band, respectively. Referring to FIG. 1B, the photon-generated electrons will drift to collector, namely, layer 14', under the reverse bias electric field of PN junction 1', whereas the photon-generated holes will drift in the opposite direction to layer 12'. Keeping in mind that PN junction 2' is already under a forward bias, and the finite lifetime of photon-generated holes enables hole accumulation in layer 12'. This is equivalent to increasing the forward bias for PN junction 2'; as a result, electrons are emitted from the emitter, namely, from layer 11' to layer 12'. Most of the emitted electrons will diffuse to layer 13' and be swept by the large electric field to the collector, namely, layer 14', forming a large gained current in addition to the photon-generated current. Through optimized design, this prior art phototransistor can provide current gain as large as $10^5$, giving responsivity as large as $10^4$ A/W.

However, from material epitaxy point of view, to form a phototransistor according to FIG. 1A as solar blind UV detector is very challenging. The first challenge is that due to lack of native substrate, low-dislocation high-Al-content AlGaN for layer 13' is very difficult to obtain. As such, a solar blind photodetector made according to FIG. 1A would suffer from large dark current. The second challenge is as severe, coming from the difficulty to form high-quality N-type AlGaN for layer 11' immediately upon the formation of P-type layer 12', since after forming P-type layer 12' in an epitaxial reactor, the P-type dopant (Mg) has strong memory and surface segregation effects, making the sequent N-type layer very difficult to realize.

Embodiments of the present invention provide a solar blind UV photodetector overcoming or improving these and other shortcomings presenting in the prior art.

SUMMARY OF THE INVENTION

One aspect of the present invention provides an UV photodetector which includes: a substrate, a template layer formed on the substrate, an intrinsic AlGaN layer formed on the template layer, a first n-type AlGaN layer and a second n-type AlGaN layer formed on the intrinsic AlGaN layer side-by-side and separated by a gap, wherein the gap exposes the intrinsic AlGaN layer.

Another aspect of the present invention provides an UV photodetector which includes: an UV transparent substrate, an UV transparent template layer formed on the substrate, a first UV transparent n-type AlGaN layer formed on the UV transparent template layer, an intrinsic AlGaN layer formed on the first UV transparent n-type AlGaN layer, a second n-type AlGaN layer formed on the intrinsic AlGaN layer, and a p-type layer formed on the second n-type AlGaN layer.

Still another aspect of the present invention provides an UV focal plan array (FPA) imaging device, which includes an array of the UV photodetectors according to the above first aspect or the above second aspect of the present invention.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

The term "intrinsic semiconductor" as used in this specification refers to insulating and high-quality semiconductors. In its ordinary definition, intrinsic semiconductor simply means undoped semiconductor, free of dopants and other impurities. For high-quality large bandgap semiconductors, such as GaN, AlGaN, and AlN, being intrinsic means being insulating at room temperature too. However, because of the absence of native substrate, epitaxially formed undoped GaN or AlGaN may not be free of defects, therefore may not be insulating enough for the use of light absorbing region in a photodetector. In such circumstances, a proper doping of deep level impurities to compensate the defect-related conductivity without degrading the semiconductor quality is required. For example, GaN or AlGaN can be doped with a deep level impurity such as Fe (iron) to compensate point defects such as nitrogen vacancies generated n-type conductivity.

The term "high quality semiconductor" as used in this specification refers to semiconductor of linear defect density such as dislocation density less than $10^9$ cm$^{-2}$, preferably less than $10^8$ cm$^{-2}$, of point defect density less than $10^{16}$ cm$^{-3}$, preferably less than $10^{14}$ cm$^{-3}$.

Figure 2A:
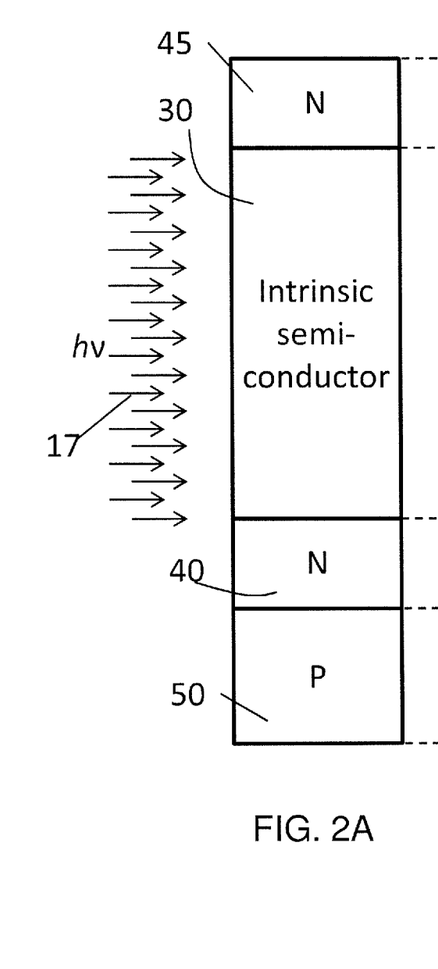
FIG. 2A illustrates a layer structure of a photodetector according to one aspect of the present invention
Figure 2B:
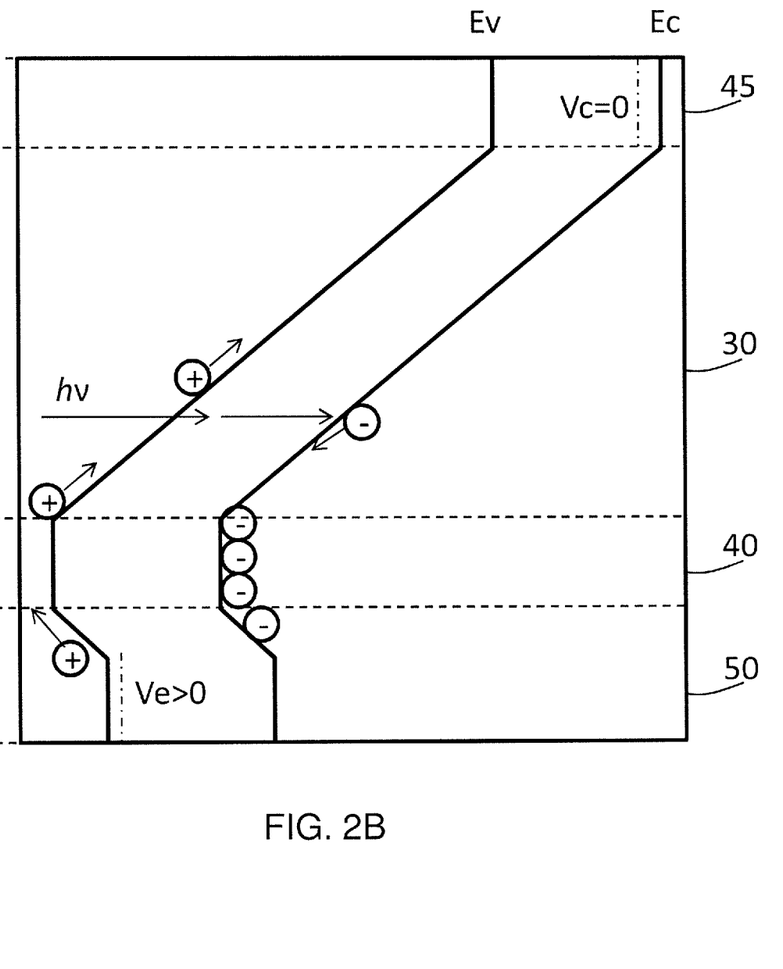
FIG. 2B illustrates the band diagram of the photodetector shown in FIG. 2A.

FIGS. 2A and 2B illustrate the principle of embodiments of the present invention. As depicted in FIG. 2A is a layer structure of a photodetector, together with its corresponding band diagram illustrated in FIG. 2B. As seen, the photodetector at least contains an intrinsic semiconductor layer 30, acting as a photoconductor whose conductance changes upon illumination, two N-type semiconductor layers 40 and 45 sandwiching layer 30, and a P-type semiconductor layer 50 forming PN junction with N-type layer 40. P-type semiconductor layer 50 is positively biased with regard to N-type layers 40 and 45 and there is a large electric field set up within the intrinsic layer 30 by a voltage drop between N-type layers 40 and 45. The voltage drop needed is to set up an electric field of $1.0 \times 10^4$-$1.0 \times 10^6$ V/cm within layer 30. For example, if the thickness of layer 30, measured between the two interfaces formed between layer 30 with layers 40 and 45, is 1.0 micron, then the voltage drop needed is 1-100 volts. When shining photon flux 17 to layer 30, photocurrent occurs because electrons and holes are excited to conduction and valence band and are swept by the electric field to layers 40 and 45, respectively. Additional current gain comes from the forward biased PN junction between layers 50 and 40, since photon-generated electrons because of finite lifetime accumulating in layer 40 lower the PN junction barrier and result in hole injection from P-type layer 50 to N-type layer 40. These injected holes can diffuse through layer 40 and reach layer 30 then be swept by the electric field to layer 45. Hence, layers 50 and 45 act as emitter and collector, respectively. In short, the photodetector according to embodiments of the present invention contains a photoconductor in series connection to a current gain mechanism, which is a forward biased junction such as a PN junction or a Schottky junction.

For this photodetector to work properly a few material concerns need to be addressed. Firstly, layer 30 needs to be of high crystal quality and insulating, in order to set up a large electric field within layer 30 with negligible leakage current (dark current). The electric field setting up within layer 30 can be larger than $10^4$ V/cm, for example, $1.0 \times 10^4$-$1.0 \times 10^6$ V/cm, or $5.0 \times 10^4$-$5.0 \times 10^5$ V/cm. The dark current under such an electric field can be at least three orders of magnitude lower than the current under illumination, for example less than 1 nA. Another consideration is the thickness of layer 40. If it is too thick, holes injected from layer 50 may not be able to diffuse into layer 30. They could be exhausted by recombining with the accumulated non-equilibrium electrons within layer 40. This will greatly reduce the current gain. On the other hand, the thickness of layer 40 has to be thick enough to assure existing a flat band zone (zero electric field zone). A flat band zone in layer 40 is necessary in order to set up a large electric field within layer 30 and form a proper PN junction to layer 50. In general, the thickness and doping of layer 40 should allow at least a 50 nm-thick flat band zone within layer 40, or a 100 nm-thick flat band zone, or a 50-200 nm-thick flat band zone. The thickness and doping of layer 40 can be in the range of 50-400 nm and $1 \times 10^{18}$-$1 \times 10^{19}$ cm$^{-3}$.

With the operation principle being explained above, various embodiments in accordance with the present invention will be provided in the following.

Figure 3:
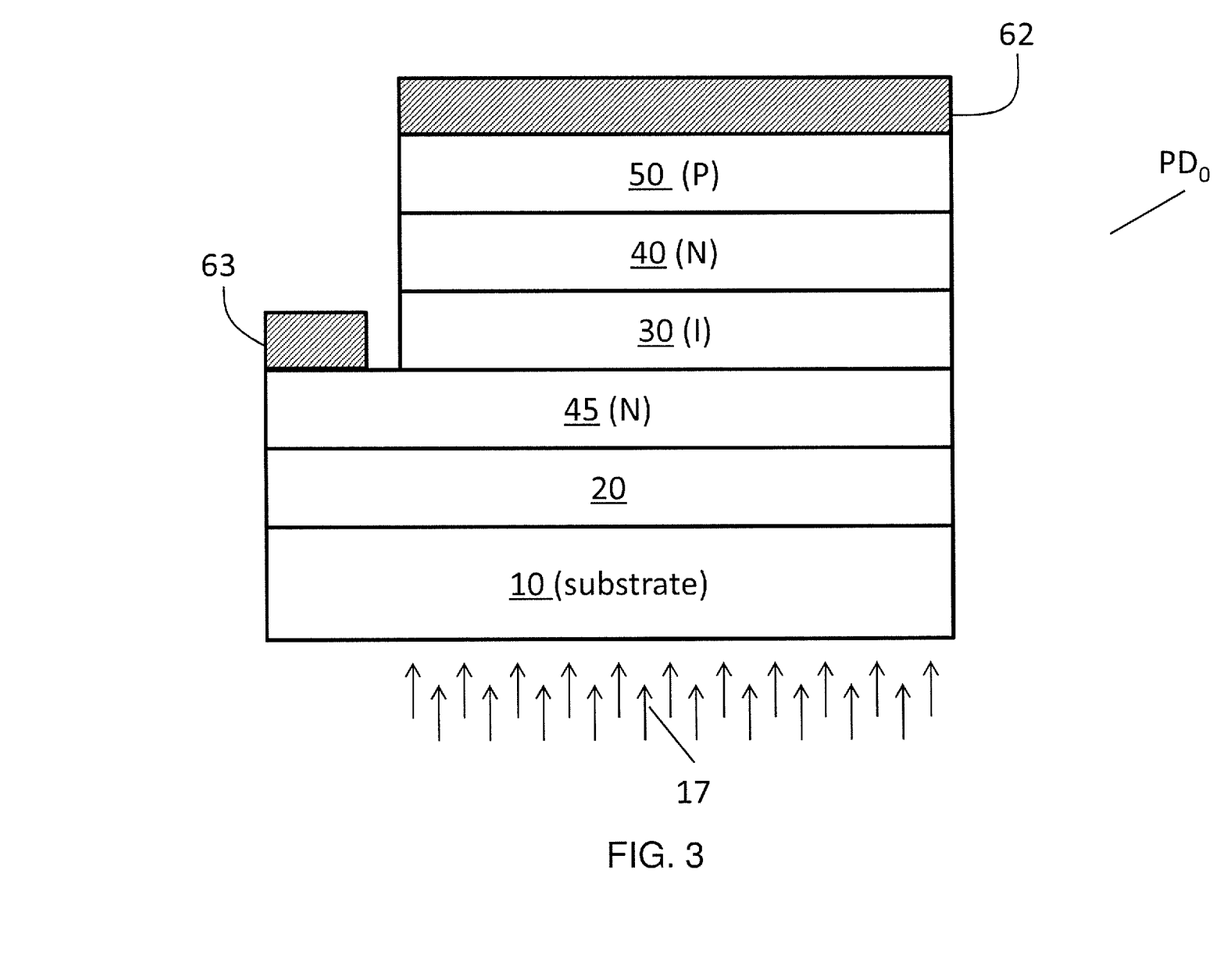
FIG. 3 illustrates a cross-sectional schematic of a photodetector structure ($PD_0$) according to an embodiment of the present invention.

Illustrated in FIG. 3 is a schematic layer structure of a photodetector (PD$_0$) according to an embodiment of the present invention. As seen, photodetector PD$_0$ can be formed over a high quality template or window layer 20, which in turn can be formed on a substrate 10. For solar blind applications, substrate 10 can be a sapphire or AlN wafer and window layer 20 can be an AlN layer or AlGaN layer with Al-content higher enough to assuring UV light transparency to the light absorbing layer 30, which can be made of intrinsic AlGaN with a thickness of 100-500 nm, such as 200-300 nm. In practice, the Al-content of window layer 20 can be at least 20%, or 30%, or 50%, more than that of the light absorbing layer 30. For example, the Al-content of window layer 20 can be in the range of 60%-100%, while the Al-content of layer 30 is 46% for 280 nm and shorter wavelength detection. N-type layer 45 can be a Si-doped AlGaN layer transparent to the targeted detection wavelength with an Al-content in the range of 50%-70%. For solar blind detection of 280 nm and shorter wavelengths, the targeted Al-content of the intrinsic AlGaN material for layer 30 is not less than 46% (here calculated by assuming GaN and AlN bandgap energy to be respectively 3.42 and 6.2 eV, and bowing parameter for AlGaN bandgap energy to be −1), for example, 46% to 100%, or 47% to 55%. Formed on layer 30 is an N-type layer 40, which can be a Si-doped AlGaN layer of the same Al-content and Si-doping level with those of layer 45. Layer 50 can contain a p-type AlGaN layer (Al-content similar or equal to those of layers 40/45) and a p-type GaN ohmic contact layer formed on the p-type AlGaN layer and with the p-type AlGaN layer facing or in contact with N-type layer 40. In some exemplary embodiments, the Al-content and thickness of layer 30 are respectively in the range of 46% to 50%, such as 46% and 200-400 nm, such as 250-300 nm, and the Al-content and Si-doping level of layers 40/45 are respectively 50% to 70%, such as 60%, and $1.0 \times 10^{18}$ to $1.0 \times 10^{19}$ cm$^{-3}$, such as $3 \times 10^{18}$ cm$^{-3}$; and the thicknesses of layers 40 and 45 are respectively 100-300 nm, such as 150-250 nm, and 500-1500 nm, such as 700-1000 nm; and the thickness and Al-content of the AlGaN layer in layer 50 are 50-150 nm, such as 80-110 nm and 50-70%, respectively; and the thickness of the p-type GaN ohmic contact layer is about 50-150 nm, such as 80-110 nm.

Ohmic contacts 62 and 63 are formed on layers 50 and 45, respectively. When working as a photodetector, contact 62 is positively biased regard to contact 63. When shining photon flux 17 to layer 30, through substrate 10 and layers 20 and 45, photocurrent occurs because electrons and holes are excited to conduction and valence band of layer 30 and are swept by the electric field to layers 40 and 45, respectively. Photon-generated electrons will accumulate in layer 40's flat band zone as non-equilibrium carriers because of their finite carrier lifetime, lowering the PN junction barrier between layers 50 and 40. This will result in additional current gain as hole injection from P-type layer 50 to N-type layer 40 happens in response to the lowered PN junction barrier. These injected holes can diffuse through layer 40 and reach layer 30 then be swept by the electric field to layer 45.

Also noticed from FIG. 2A and FIG. 3, for photodetectors made according to embodiments of the present invention, there is no need to epitaxially form any N-type layer on a P-type layer, eliminating the prior art P-type dopant's memory effect and surface segregation problem which hurt photodetector's performance.

Figure 4:
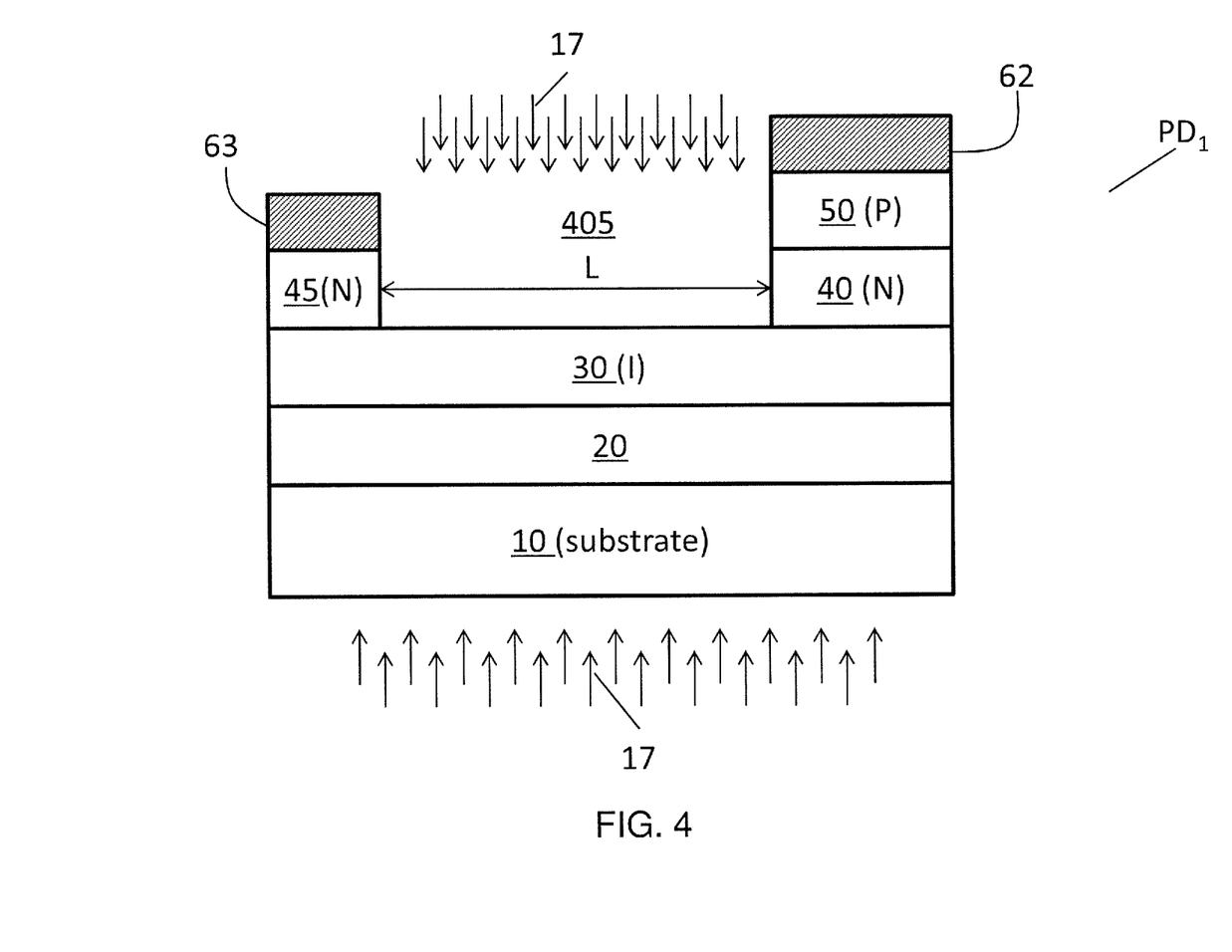
FIG. 4 illustrates a cross-sectional schematic of a photodetector structure ($PD_1$) according to an embodiment of the present invention.

Further illustrated in FIG. 4 is a schematic layer structure of a photodetector (PD$_1$) according to another embodiment of the present invention. Compared to PD$_0$, PD$_1$ is of a horizontal structure, where n-type layers 45 and 40 are both formed on layer 30 side-by-side and separated by a gap 405. The gap 405 between layers 45 and 40 exposes layer 30 to light impinging from above, opening more design flexibility. Gap 405 can be formed via etching or selective-area epitaxy, as known to the field of interest. As shown, gap 405 may have a lateral dimension L of 1-3 microns, for example, 2 microns. The ratio of the surface area of layer 30 exposed by gap 405 to the surface area of layer 40 (or layer 45) can be in the range of 0.8 to 1.2, for example, 1.0. Even though not shown in FIG. 4, the top surface of layer 30 exposed by gap 405 may be protected by a UV transparent dielectric layer, such as a layer made of CaF$_2$, MgF$_2$ or SiO$_2$ or a mixture of these materials with a thickness in the range of a few tens of nanometers to a few hundred nanometers, such as 30-600 nm or 60-300 nm. In some embodiments according to this aspect of the present invention, PD$_1$ structure can be formed over a high quality template or window layer 20, which in turn can be formed on a substrate 10. For solar blind applications, substrate 10, window layer 20, light absorbing layer 30, N-type layers 40 and 45, P-type layer 50, and ohmic contacts 62 and 63 can be similar to their counterparts found in PD$_0$ shown in FIG. 3 and described in details previously.

In some other embodiments according to this aspect of the present invention, since gap 405 allows light reception by layer 30 from above, substrate 10, layer 20, n-type layers 45 and 40, p-type layer 50 are not necessary to be UV transparent. This opens more approaches to form high-quality layer 30 for light absorption. According to this aspect of the present invention, substrate 10 can be selected from suitable substrates other than UV transparent substrates. For examples, substrate 10 can be a Si wafer, or a high-quality bulk GaN wafer, layer 20 can be a high-quality GaN layer, and layer 30 can be a thin high-quality AlGaN with a thickness of 200-400 nm, formed thereon, and layers 40, 45, 50 can be more flexible to design their Al-content for better carrier injection without worrying about their UV transparency. For instances, a photodetector is made possible by using high-quality GaN material for layers 20, 40, 45, and 50, only leaving layer 30 to be made of AlGaN for solar blind UV detection with an Al-content in the range of 46% to 50%.

Detectors made according to this aspect of the present invention function by the same principle as explained above.

The UV detector structure PD$_1$ shown in FIG. 4 can be epitaxially formed by metalorganic chemical vapor deposition (MOCVD), using TMA (trimethylaluminum), TMG (trimethylgallium) NH$_3$ (ammonia), SiH$_4$ (silane) and Cp$_2$Mg (bis(cyclopentadienyl)magnesium) as precursors, respectively for Al, Ga, N, Si and Mg sources. A c-plane sapphire substrate (10) is loaded into an MOCVD reactor. Under hydrogen and ammonia gas flow and ambient of pressure 70 mbar, the substrate is heated with a ramping rate approximately 80-100° C./min from room temperature to 1000° C. Then the substrate is cooled down with a ramping rate 60° C./min from 1000° C. to 650° C. for a nucleation AlN layer deposition. The nucleation layer AlN is of thickness 20 nm and formed via opening the TMA and ammonia sources at the same time, with a growth rate of 5 nm/min.

Then the substrate with AlN nucleation layer is heated up to 1320° C. with a ramping rate 100° C./min for a 1.0-2.0 μm-thick AlN layer (20) formation, with a growth rate of 1.0-3.0 L m/hour. Sequentially, the wafer is cooled down to 1080-1100° C. for the formation of layer 30, an insulating, intrinsic AlGaN layer. For solar blind 280 nm and shorter UV detection, in some embodiments, layer 30 is made of 200 nm-thick undoped $Al_{0.46}Ga_{0.54}N$; in some embodiments, layer 30 is made of 150 nm-thick undoped $Al_{0.46}Ga_{0.54}N$; in some embodiments, layer 30 is made of 300 nm-thick undoped $Al_{0.48}Ga_{0.52}N$. Following layer 30, at the similar temperature and gas flow conditions (except for the silane and TMA flows), a 100-400 nm-thick n-$Al_{0.55}Ga_{0.45}N$ layer doped with Si at $3.0\times10^{18}$ cm$^{-3}$ is formed over layer 30 for layers 40/45. Then the wafer temperature is reduced to 900-1020° C. for formation of p-AlGaN layer 50, which contains a 50-100 nm-thick Mg doped $Al_{0.60}Ga_{0.40}N$ layer and a 50-100 nm-thick Mg doped GaN layer, with a Mg-doping level around $1.0\text{-}10.0\times10^{19}$ cm$^{-3}$, with the 50-100 nm-thick Mg doped $Al_{0.06}Ga_{0.40}N$ layer contacting layers 40/45. Upon accomplishment of the epitaxial wafer, the wafer will be undergone standard chip fabrication process. Photolithographic masking and etching will be performed to form gap 405 and expose layers 45 and 30. Then metal ohmic contacts are formed over layers 45 and 50.

Figure 5:
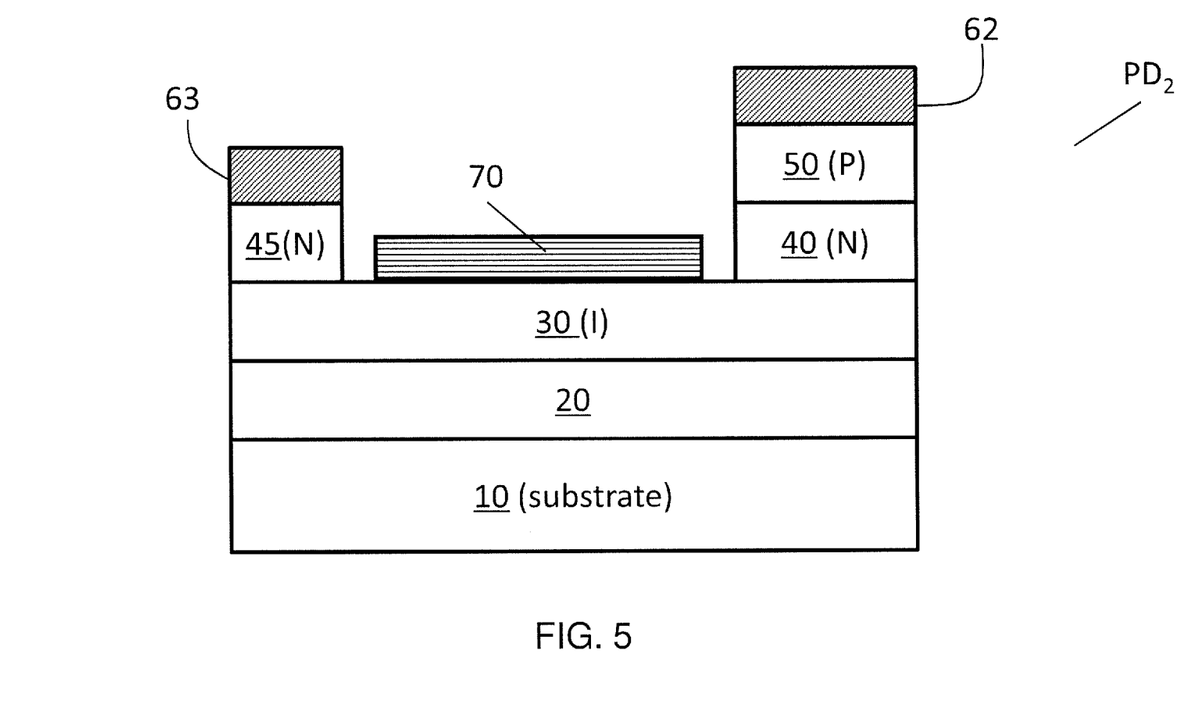
FIG. 5 illustrates a cross-sectional schematic of a photodetector structure ($PD_2$) according to an embodiment of the present invention.

Illustrated in FIG. 5 is a schematic layer structure of a photodetector (PD$_2$) according to still another embodiment of the present invention. PD$_2$ differs from PD$_1$ by having a Schottky contact 70 formed on layer 30 in the gap 405 exposed region, or formed on an UV transparent insulating layer which is formed on layer 30 in the gap 405. Schottky contact 70 can fully or partially fill the gap 405 as shown in FIG. 5. The thickness of Schottky contact 70 can be less than, equal to, or larger than the thickness of layer 40 or 45. There also can be a gap between Schottky contact 70 and layer 40 and/or between Schottky contact 70 and layer 45, which gap exposes layer 30 (See FIG. 5) or exposes the UV-transparent insulating dielectric layer formed on layer 30. The purpose of having Schottky contact 70 is to deplete residual carriers in layer 30 so as to reduce photodetector's dark current. For this purpose, Schottky contact 70 is preferred to have a Schottky barrier height greater 1.0 eV, such as 1.5-2.5 eV. Schottky contact 70 can be made with metals selected from Al, Au, Pt, Ni, and so on or a mixture thereof. Since AlGaN materials have electron affinity potentials in the range of 2.05 eV to 4.2 eV (more Al-content, less affinity), in principle, selecting a metal of work function greater than 4.2 eV will form Schottky contact to AlGaN made layer 30, as the Schottky barrier height is the difference between the metal work function and the semiconductor's electron affinity potential.

Figure 6:
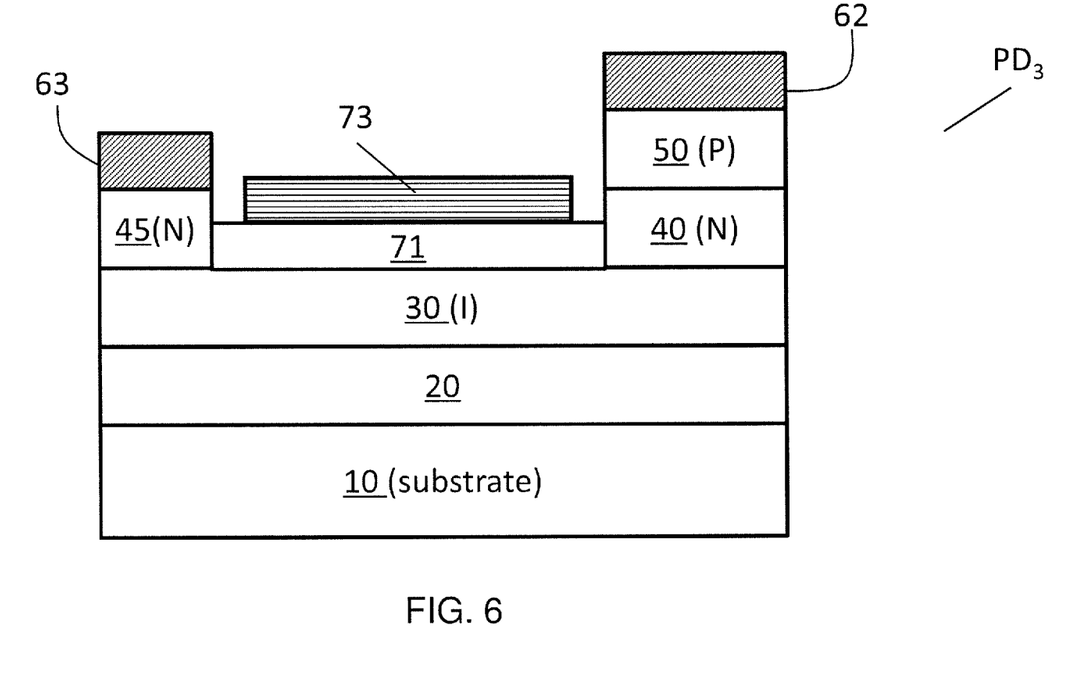
FIG. 6 illustrates a cross-sectional schematic of a photodetector structure ($PD_3$) according to an embodiment of the present invention.

Illustrated in FIG. 6 is a schematic layer structure of a photodetector (PD$_3$) according to still another embodiment of the present invention. PD$_3$ differs from PD$_1$ by having a metal-insulator-semiconductor (MIS) structure formed on layer 30 in the gap 405 exposed region. As depicted, insulating dielectric layer 71 is formed on layer 30 and followed by a metal layer 73. Layer 71 can fully or partially fill the bottom portion of gap 405 and can have a thickness less than that of n-type layer 40 or 45, for example, layer 71 can be a few nanometers to a few hundreds of nanometers, e.g., 50-200 nanometers. Metal layer 73 is formed on insulating dielectric layer 71 and can fully or partially fill gap 405 as shown in FIG. 6. The combined total thickness of layer 71 and layer 73 can be less than, equal to, or larger than the thickness of layer 40 or 45. There can be a gap between layer 73 and layer 45, or between layer 73 and layer 40 as shown in FIG. 6. For example, the thickness of insulating dielectric layer 71 can be in the range of a few nanometers to a few hundreds of nanometers such as 100 nanometers to 300 nanometers, and the thickness of metal layer 73 can be in the range of be a few hundreds of nanometers to a few microns such as 300 nanometers to 1 micron. Layers 73, 71, and 30 form an MIS structure. Metal layer 73 can be biased to further deplete layer 30 for a low dark current. It can also be used as a current quenching mechanism if there is any persistent photocurrent within the photodetector. For example, when light shone on layer 30 changes the conductance of layer 30 and leads to turn-on of PN junction between layers 50/40, as explained previously, the PN junction may not be able to shut off when the light is turned off. This is because it takes time for the accumulated non-equilibrium electrons in the flat band zone of layer 40 to disappear. Once this persistent photocurrent happens, a positive bias to metal layer 73 will deplete electrons in layer 40 and turn off the PN junction. The same current quenching mechanism can also be applied to photodetector PD$_2$ via a positive bias to Schottky contact 70.

In some embodiments, insulating dielectric layer 71 can be a $SiO_2$ layer and metal layer 73 can be an Al layer. Besides controlling the dark conductance and persistent photocurrent of layer 30, layers 73 and 71 can further function as an omnidirectional reflector to enhance the external quantum efficiency of the photodetector.

Figure 7:
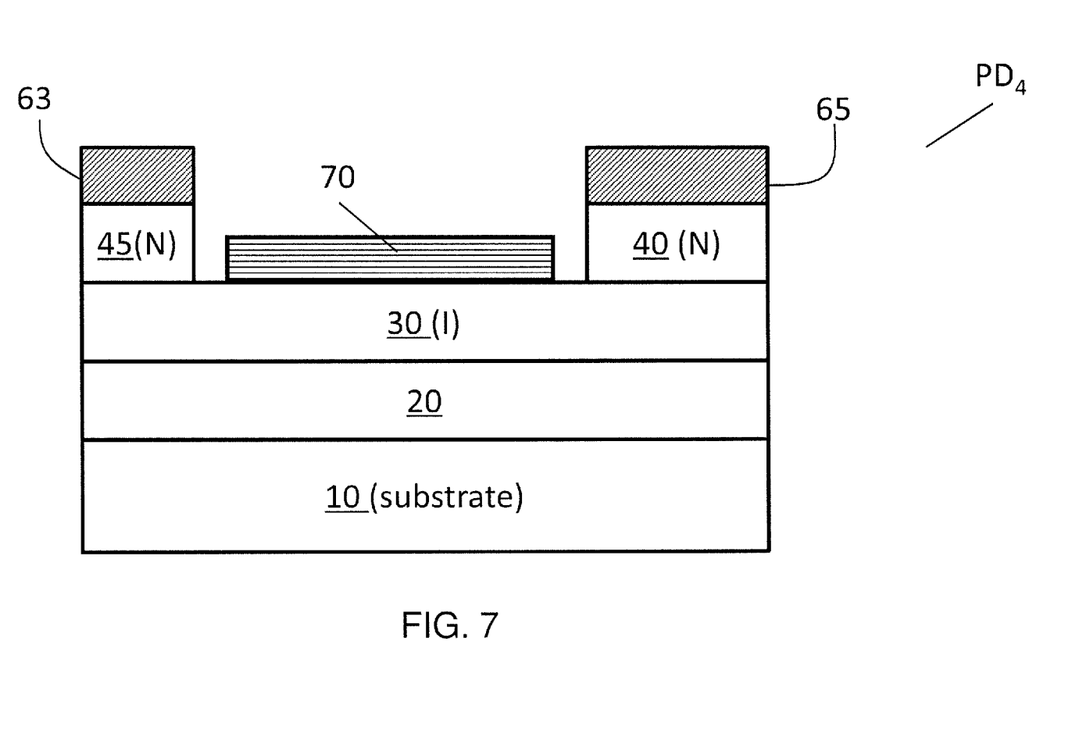
FIG. 7 illustrates a cross-sectional schematic of a photodetector structure ($PD_4$) according to an embodiment of the present invention.

Illustrated in FIG. 7 is a schematic layer structure of a photodetector (PD$_4$) according to still another embodiment of the present invention. PD$_4$ differs from PD$_2$ by replacing the current gain mechanism from a PN junction (layers 62, 50, 40 in FIG. 5) with a Schottky junction (layers 65, 40 in FIG. 7). The function principle of PD$_4$ is similar to PD$_1$, PD$_2$, and PD$_3$. Metal layer 65 can be made of Ni, Au, Al, Pt et al with a thickness in the range of 500-2000 nm, such as 800-1200 nm. Layer 65 and n-type layer 40 form a Schottky junction.

Figure 8:
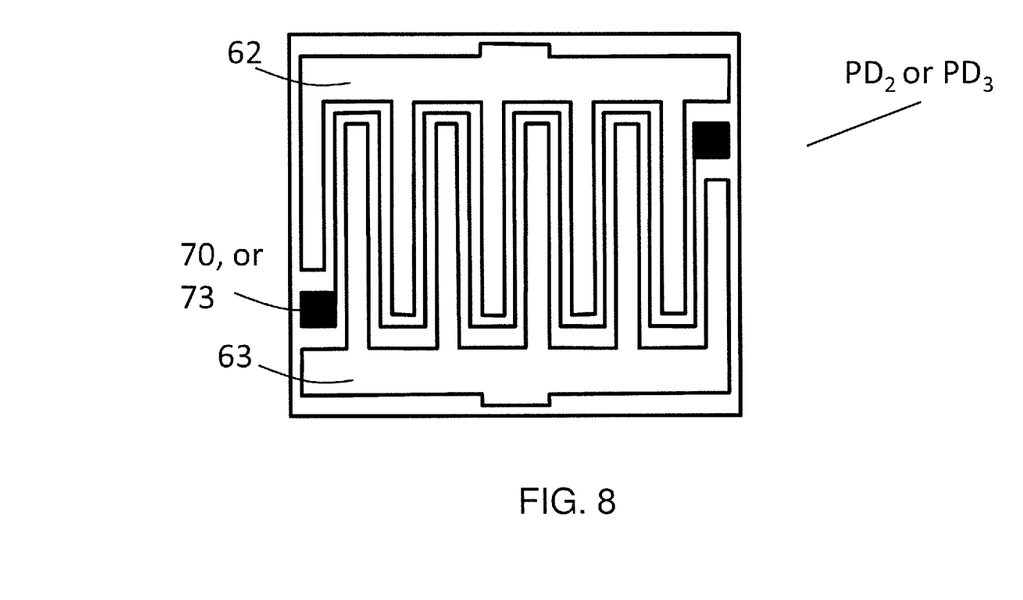
FIG. 8 illustrates plane-view of a photodetector ($PD_2$ or $PD_3$) according to an embodiment of the present invention.

The plane-view schematic of some of the photodetectors, such as PD$_2$ or PD$_3$, is illustrated in FIG. 8. As see, the ohmic contacts 62/63 have many fingers and these fingers are interdigitally spaced. Running through the interdigital contact fingers along gap 405 is the Schottky contact 70 or MIS metal contact 73. Gap 405 may take other patterns other than shown in FIG. 8. In some embodiments, n-type layer 40 and n-type layer 45 are evenly divided by gap 405, that is, n-type layer 40 and n-type layer 45 have substantially the same surface area. In some embodiments, n-type layer 40 and n-type layer 45 are unevenly divided by gap 405, that is, the surface area of n-type layer 40 may be less or larger than the surface area of n-type layer 45. In most embodiments, n-type layer 40 is a continuous layer and n-type layer 45 is a continuous layer.

Figure 9:
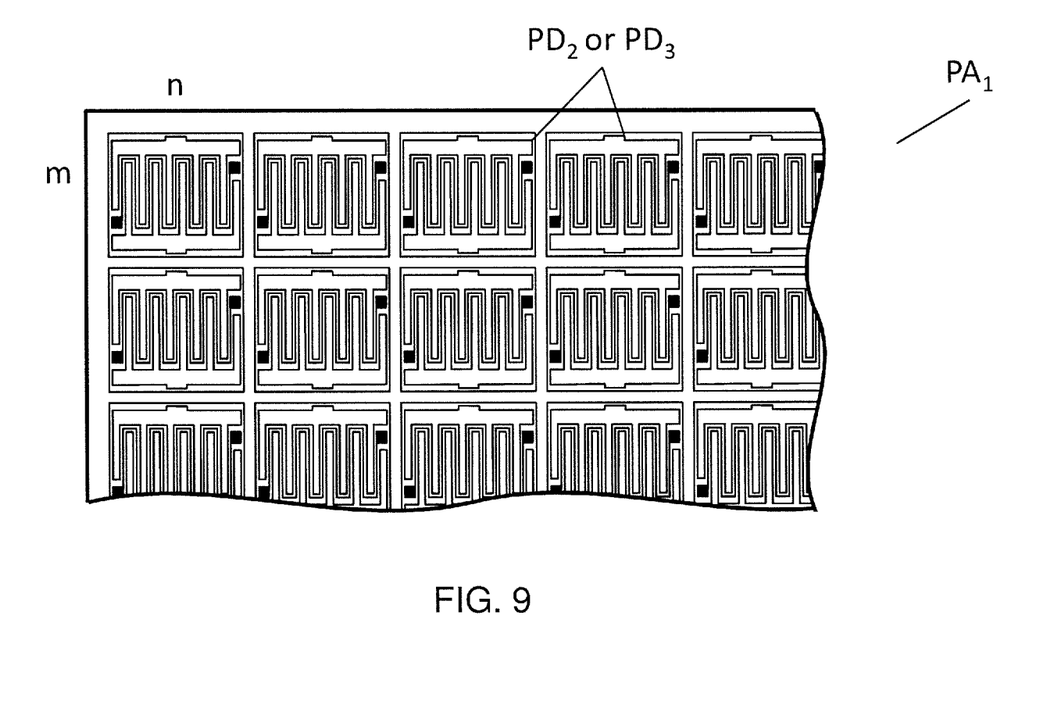
FIG. 9 illustrates plane-view of an m×n photodetector array ($PA_1$) made of photodetectors ($PD_2$ or $PD_3$) according to an embodiment of the present invention.

Many such photodetectors can form an array for UV focal plan array (FPA) imaging purpose. FIG. 9 illustrates plane-view of an m×n photodetector array (PA$_1$) made of photodetectors (PD$_2$ or PD$_3$) according to one aspect of the present invention.

To modify or enhance the detector speed by changing the depletion region profile, although not depicted in FIGS. 5-8, Schottky contact 70 or MIS structure metal layer 73 may be asymmetrically placed between the two contacts (63 and 62, or 63 and 65). For example, the Schottky contact 70 or MIS structure metal layer 73 can be located closer to the positive bias contact (e.g. 62, or 65) than to the ground or negative bias contact (e.g. 63).

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. An UV photodetector comprising:
a substrate;
a template layer formed on the substrate;
an intrinsic AlGaN layer formed on the template layer;
a first n-type AlGaN layer and a second n-type AlGaN layer formed on the intrinsic AlGaN layer side-by-side and separated by a gap, wherein the gap exposes the intrinsic AlGaN layer;
a p-type layer formed on the second n-type AlGaN layer;
an n-type ohmic contact formed on the first n-type AlGaN layer; and
a p-type ohmic contact formed on the p-type layer, wherein the p-type ohmic contact is positively biased against the n-type ohmic contact when in use.

2. The UV photodetector according to claim 1, wherein an UV transparent dielectric layer is formed on the intrinsic AlGaN layer in the gap.

3. The UV photodetector according to claim 1, wherein each of the template, the first n-type AlGaN layer, the second n-type AlGaN layer and the p-type layer is made of GaN, and an Al-content of the intrinsic AlGaN layer is in the range of 46% to 50%.

4. The UV photodetector according to claim 1, wherein a Schottky contact is formed on the intrinsic AlGaN layer in the gap.

5. The UV photodetector according to claim 1, wherein an insulating dielectric layer is formed on the intrinsic AlGaN layer in the gap, a metal layer is formed on the insulating dielectric layer, and the metal layer, the insulating dielectric layer and the intrinsic AlGaN layer form a metal-insulator-semiconductor (MIS) structure.

6. The UV photodetector according to claim 1, wherein the gap has a zigzag shape and has a lateral dimension of 1-3 microns.

7. The UV photodetector according to claim 1, wherein the substrate and the template layer are UV transparent.

8. The UV photodetector according to claim 1, wherein a thickness of the intrinsic AlGaN layer is in the range of 200-400 nm.

9. The UV photodetector according to claim 1, wherein the first n-type AlGaN layer and the second n-type AlGaN layer are doped with Si at a doping level in the range of $1.0 \times 10^{18}$ to $1.0 \times 10^{19}$ cm$^{-3}$, respectively, and an Al-content and a thickness of each of the first n-type AlGaN layer and the second n-type AlGaN layer are in the range of 50% to 70% and 100-400 nm, respectively.

10. The UV photodetector according to claim 1, wherein the p-type layer includes a p-type AlGaN layer and p-type GaN layer, the p-type AlGaN layer and the p-type GaN layer are doped with Mg at a doping level in the range of $1.0$-$10.0 \times 10^{19}$ cm$^{-3}$, respectively, and each has a thickness in the range of 50-100 nm, an Al-content of the p-type AlGaN layer is in the range of 50%-70%.

11. An UV focal plan array (FPA) imaging device, comprising an array of the UV photodetectors according to claim 1.

12. An UV photodetector comprising:
a substrate;
a template layer formed on the substrate;
an intrinsic AlGaN layer formed on the template layer;
a first n-type AlGaN layer and a second n-type AlGaN layer formed on the intrinsic AlGaN layer side-by-side and separated by a gap, wherein the gap exposes the intrinsic AlGaN layer;
a p-type layer formed on the second n-type AlGaN layer; and
a Schottky contact formed on the intrinsic AlGaN layer in the gap.

13. An UV photodetector comprising:
a substrate;
a template layer formed on the substrate;
an intrinsic AlGaN layer formed on the template layer;
a first n-type AlGaN layer and a second n-type AlGaN layer formed on the intrinsic AlGaN layer side-by-side and separated by a gap, wherein the gap exposes the intrinsic AlGaN layer;
a Schottky contact formed on the intrinsic AlGaN layer in the gap; and
a metal layer formed on the second n-type AlGaN layer forming a Schottky junction therebetween.

14. The UV photodetector according to claim 13, wherein a p-type layer is formed on the second n-type AlGaN layer.

* * * * *